United States Patent
Bae et al.

(10) Patent No.: US 8,053,312 B2
(45) Date of Patent: Nov. 8, 2011

(54) SEMICONDUCTOR DEVICE AND METHOD FOR FABRICATING THE SAME

(75) Inventors: Sang-Man Bae, Ichon-shi (KR); Dong-Heok Park, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 86 days.

(21) Appl. No.: 11/259,960

(22) Filed: Oct. 26, 2005

(65) Prior Publication Data

US 2006/0141694 A1   Jun. 29, 2006

(30) Foreign Application Priority Data

Dec. 28, 2004   (KR) .................. 10-2004-0113894

(51) Int. Cl.
*H01L 21/336* (2006.01)
(52) U.S. Cl. ...................................... 438/257; 438/211
(58) Field of Classification Search .................. 438/154, 438/E21.645–E21.694, 257, 211; 257/325–317
See application file for complete search history.

(56) References Cited

U.S. PATENT DOCUMENTS

| 5,480,838 | A | * | 1/1996 | Mitsui ........................... 438/270 |
| 6,146,795 | A | * | 11/2000 | Huang et al. .................... 430/30 |
| 6,933,081 | B2 | * | 8/2005 | Yang et al. ....................... 430/5 |
| 2002/0100930 | A1 | * | 8/2002 | Yaegashi ...................... 257/315 |
| 2003/0068875 | A1 | * | 4/2003 | Son ............................... 438/587 |
| 2003/0107088 | A1 | * | 6/2003 | Inumiya et al. ................ 257/368 |
| 2004/0016956 | A1 | * | 1/2004 | Choi et al. .................... 257/315 |

FOREIGN PATENT DOCUMENTS

KR   10-2001-0075260   8/2001

* cited by examiner

*Primary Examiner* — Quoc Hoang
*Assistant Examiner* — Tony Tran
(74) *Attorney, Agent, or Firm* — Kilpatrick Townsend & Stockton LLP

(57) ABSTRACT

A semiconductor device and a method for fabricating the same are provided. The method includes: forming a plurality of protruded patterns smaller than gate structures by selectively removing predetermined portions of a substrate; and forming the gate structures over the protruded patterns. The semiconductor device includes: a plurality of protruded substrate portions smaller than the gate structures; and a plurality of gate structures encompassing the protruded substrate portions, wherein channels are formed on surfaces of the protruded substrate portion.

12 Claims, 11 Drawing Sheets

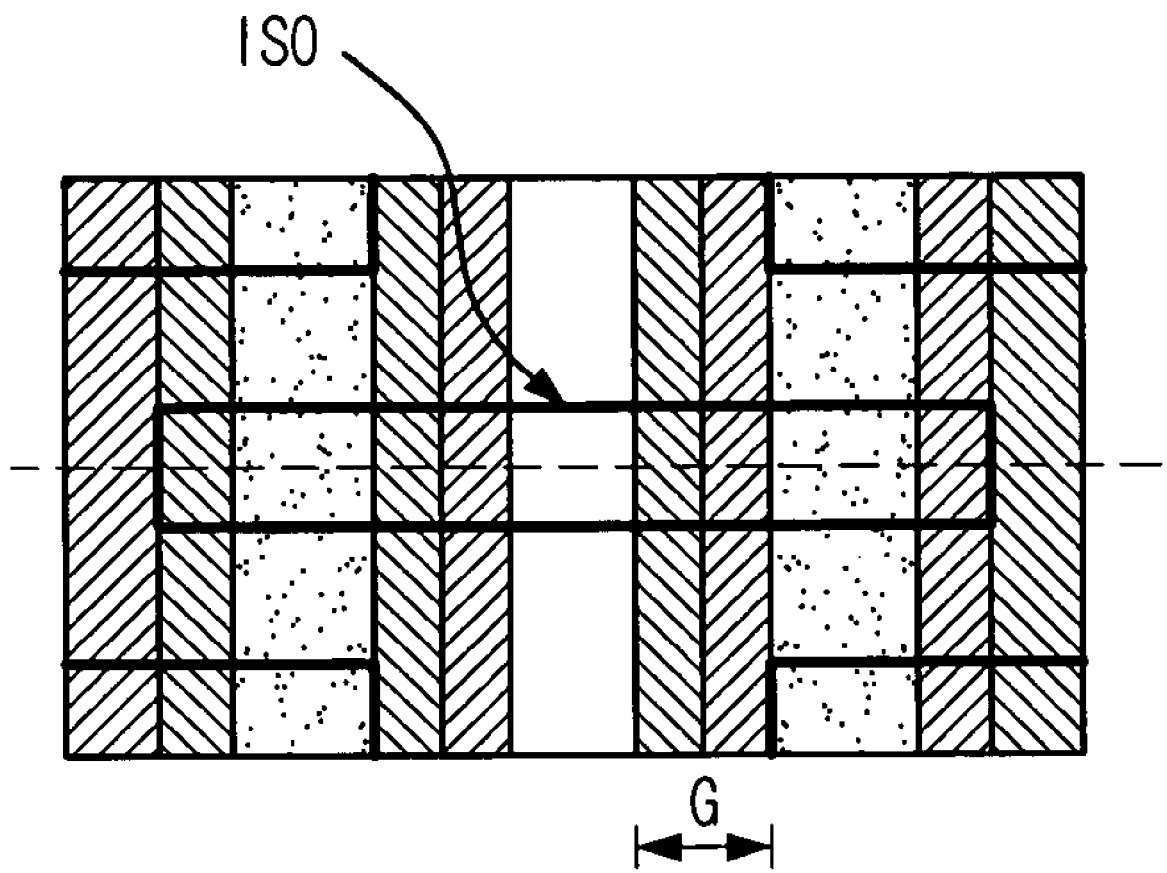

SEMICONDUCTOR DEVICE AND METHOD FOR FABRICATING THE SAME

FIELD OF THE INVENTION

The present invention relates to a semiconductor device; and, more particularly, to a semiconductor device with gate structures and a fabrication method thereof.

DESCRIPTION OF RELATED ARTS

As semiconductor devices have been highly integrated, sizes of gate structures have also been scaled down due to the decreasing design rule of metal oxide semiconductor (MOS) transistors. Hence, channel lengths have been smaller, resulting in many limitations.

Among various suggested methods of lengthening the channels, one example is that portions of a substrate in which source/drain regions are to be formed adjacent to the gate structures are partially recessed, thereby increasing the channel lengths artificially. Another example of lengthening the channels is to form the gate structures of MOS transistors in the shape of steps.

FIG. 1 is a cross-sectional view showing a conventional semiconductor device.

A plurality of device isolation regions 11 are formed in a substrate 10. A gate insulation layer 15, a gate polysilicon layer 16 and a gate metal layer 17 are sequentially formed on the substrate 10 and then, a gate hard mask 19 is formed thereon. Afterwards, an oxide layer 18 is formed by oxidizing sidewalls of the gate polysilicon layer 16.

A sidewall insulation layer 23 is formed on each sidewall of gate structures, and an ion implantation process is performed to form junction regions 22A and 22B connected to each storage node and bit line.

The reason for forming the gate metal layer 17 on the gate polysilicon layer 16 is to increase conductivity of the gate structures. The gate hard mask 19 is typically formed by using silicon nitride to protect the gate structures against a subsequent self-alignment process. The oxide layer 18 formed on the sidewalls of each gate structure protects the gate structures during formation of storage node/bit line contact plugs 24.

Also, the sidewall oxidation of the gate polysilicon layer 16 recovers micro-trenches generated on the gate structures and damages caused by using a plasma. The sidewall oxidation is also carried out to oxidize the remaining electrode materials on the substrate 10 and increase the thickness of the gate insulation layer 15 disposed at the edge side of the individual gate structure.

During the sidewall oxidation process, a gate bird's beak is formed at the bottom edges of the gate polysilicon layer 16. The gate bird's beak improves device reliability. Especially, depending on the thickness and properties of the gate insulation layer 15, the gate insulation layer 15 disposed at the edge side of the individual gate structure affects a hot carrier characteristic, sub-threshold characteristics such as off-leakage, gate-induced drain leakage (GIDL), a punch-through characteristic, a device operation speed and so forth.

The gate structures shown in FIG. 1 are typically formed ones. However, as semiconductor devices have been highly integrated, widths of the gate structures have been narrowed, thereby decreasing channel lengths. Due to the decreasing channel lengths, the typical gate structures may have many limitations.

Hence, instead of forming the bottom part of the gate structure in a simple line type as shown in FIG. 1, one suggested approach is to form the bottom part of the gate structure in the shape of a step for the purpose of increasing the channel length. Hereinafter, this gate structure type will be referred to as a step gate structure.

FIG. 2 is a top view showing another conventional semiconductor device including the aforementioned step gate structures.

As illustrated, bottom parts of the gate structures G are formed in the shape of a step. A reference denotation 'ISO' represents a mask pattern used for forming device isolation layers.

FIGS. 3A to 3E are cross-sectional views of the other conventional semiconductor memory device for illustrating a fabrication method thereof. It should be noted that the same reference numerals are used for the same elements described in FIG. 1.

Referring to FIG. 3A, a plurality of device isolation layers 11 are formed inside certain regions of a substrate 10. A plurality of mask patterns 12A and 12B for forming step gate structures are formed on predetermined portions of the substrate 10. Then, using the mask patterns 12A and 12B, the predetermined portions of the substrate 10 are etched to form a plurality of trenches 13. The predetermined portions include regions where a portion of the individual gate structure is to be formed and regions where junction regions to be connected individually with storage nodes and a bit line are to be formed. Hereinafter, the junction regions to be connected with the storage nodes will be referred to as the storage node junction regions and, the junction region to be connected with the bit line will be referred to as the bit line junction region.

Referring to FIG. 3B, the mask patterns 12A and 12B are removed. Then, a first ion implantation process is performed to form a plurality of first impurity regions 14. The first ion implantation process is specifically performed to control a threshold voltage. If N-type channels are to be formed, P-type impurities are implanted.

Referring to FIG. 3C, a number of gate structures are formed such that a bottom portion of the individual gate structure is disposed inside a portion of the corresponding trench 13. Each of the gate structures includes gate insulation layers 15 and 18, gate conductive layers 16 and 17 and a gate hard mask layer 19. Mask patterns 21 covering the regions for the storage node junction regions are formed and, a second ion implantation process is performed on the region for the bit line junction region, thereby forming a second impurity region 20. The second ion implantation is especially employed to make the storage node junction regions and the bit line junction region asymmetrical.

Referring to FIG. 3D, the mask patterns 21 are removed and, a third ion implantation process is performed to form the aforementioned storage node regions and bit line junction region. The storage node junction regions are denoted with a reference numeral 22A, while the bit line junction region is denoted with a reference numeral 22B. Since the second ion implantation process is performed on the bit line junction region 22B prior to the third ion implantation process, the storage node junction regions 22A and the bit line junction region 22B become asymmetric after the third ion implantation process.

Referring to FIG. 3E, spacers 23 are formed on each sidewall of the gate structures and, since the spacer formation process is well known, detailed description of the spacer formation will be omitted. Then, storage node contact plugs 24A and a bit line contact plug 24B are formed. The storage node contact plugs 24A are in contact with the storage node junction regions 22A, and the bit line contact plug 24B is in contact with the bit line junction region 22B.

As described above, as semiconductor devices have been highly integrated, sizes of gate structures have also decreased. Thus, in an attempt to secure channel lengths, storage node junction regions and bit line junction regions are formed to be asymmetric and step gate structures are formed.

However, if a width of the gate structure is approximately 100 nm, it is limited to increase the channel length by the above described ion implantation processes. Since a width of a target pattern is too narrow, it is difficult to achieve a stable patterning by a conventional lithography process.

As the width of the gate structure has decreased, the channel length has also decreased. However, the decreased channel length causes an increase of an impurity concentration doped onto the channel, for instance, a boron concentration in an N-type channel. Due to the increased impurity concentration, an electric field between the storage node junction region and the channel is also increased. AS a result, charged electrons stored into a storage node starts leaking, thereby resulting in a difficulty in securing a refresh time in a semiconductor memory device.

The channel length is secured by forming the storage node junction region and the bit line junction region asymmetrically as described above or by forming the gate structure in a recess type obtained by filling a portion of the gate structure into a substrate. However, in sub-100 nm semiconductor technology, it may be difficult to secure a refresh time through the former method due to diffusion of impurities, for instance, boron in the case of an N-type channel, or to obtain a stable patterning through the latter method.

SUMMARY OF THE INVENTION

It is, therefore, an object of the present invention to provide a semiconductor device and a method for increasing a channel length by forming a pattern smaller than a gate structure at a bottom portion of the gate structure without employing a patterning process.

In accordance with an aspect of the present invention, there is provided a method for fabricating a semiconductor device, including: forming a plurality of protruded patterns smaller than gate structures by selectively removing predetermined portions of a substrate; and forming the gate structures over the protruded patterns.

In accordance with another aspect of the present invention, there is provided a semiconductor device, including: a plurality of protruded substrate portions smaller than the gate structures; and a plurality of gate structures encompassing the protruded substrate portions, wherein channels are formed on surfaces of the protruded substrate portion.

BRIEF DESCRIPTION OF THE DRAWINGS

The above and other objects and features of the present invention will become better understood with respect to the following description of the preferred embodiments given in conjunction with the accompanying drawings, in which:

FIG. 2 is a top view showing another conventional semiconductor device including step gate structures;

DETAILED DESCRIPTION OF THE INVENTION

A semiconductor device and a method for fabricating the same in accordance with exemplary embodiments of the present invention will be described in detail with reference to the accompanying drawings.

Figure 1:
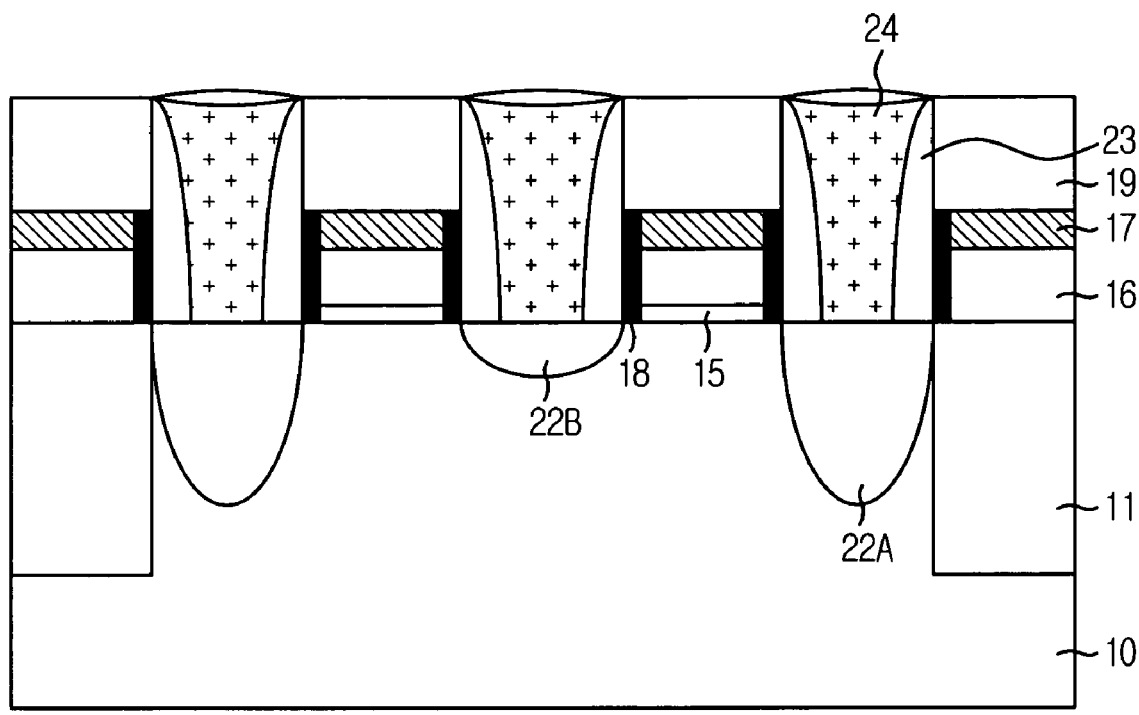
FIG. 1 is a cross-sectional view of a conventional semiconductor device for illustrating a method for fabricating the same.
Figure 3A:
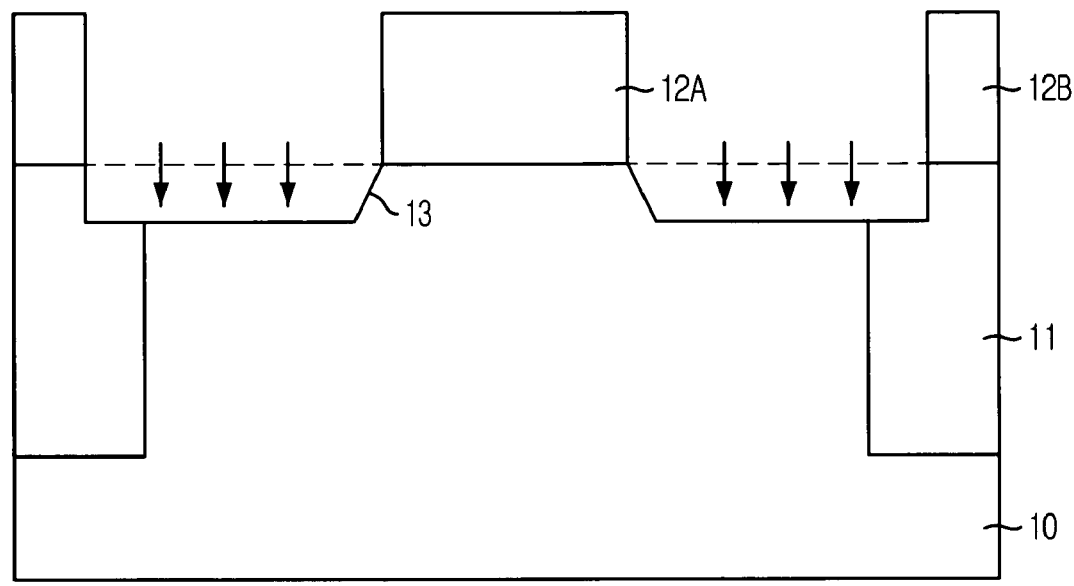
FIGS. 3A to 3E are cross-sectional views of the conventional semiconductor device shown in FIG. 2 for illustrating a method for fabricating the same.
Figure 3B:
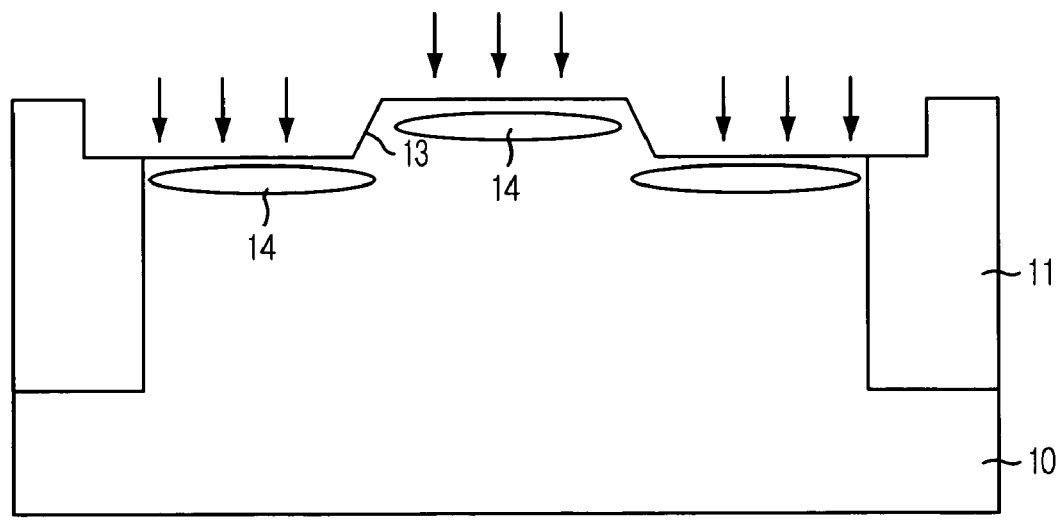
Figure 3C:
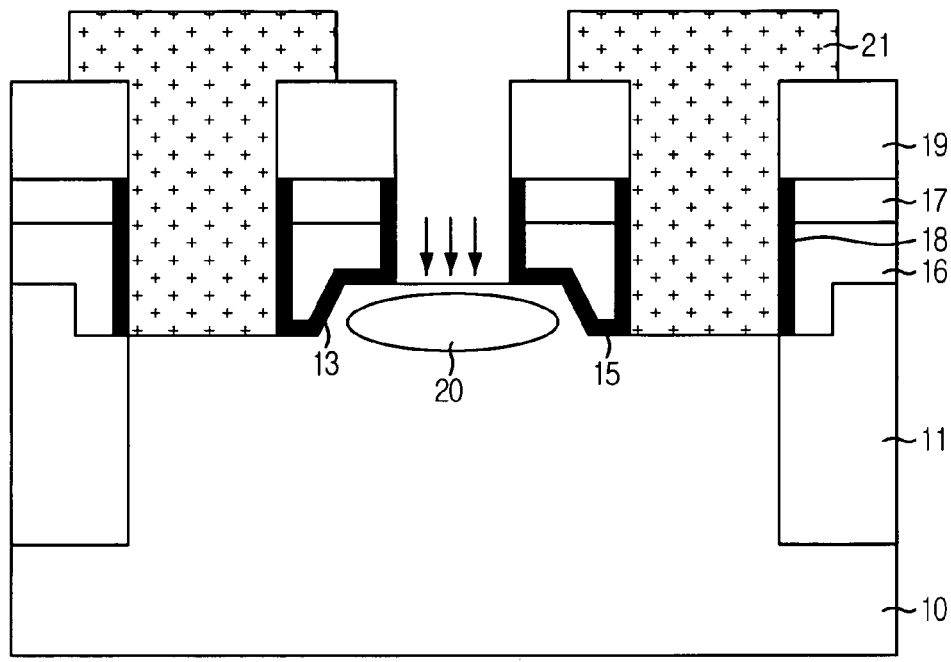
Figure 3D:
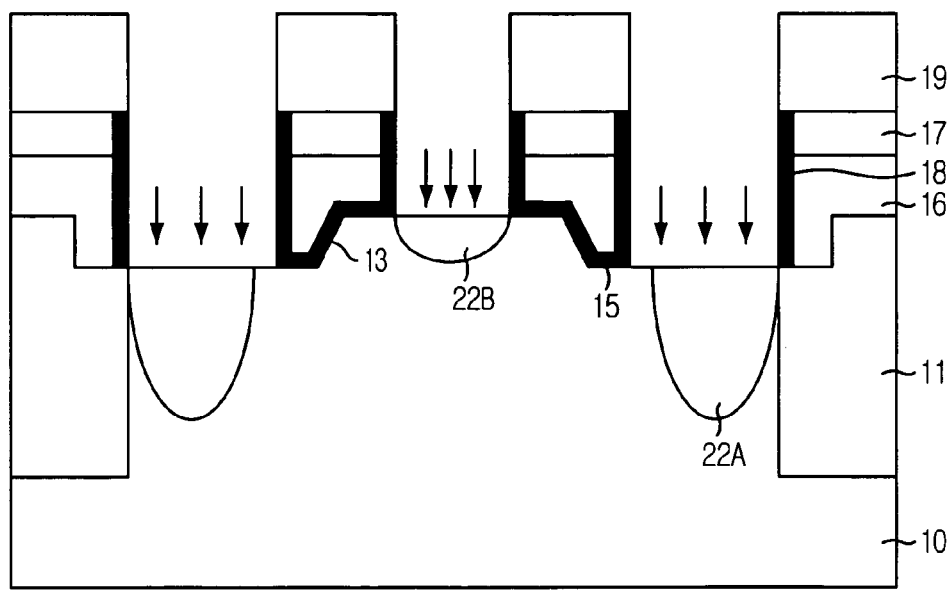
Figure 3E:
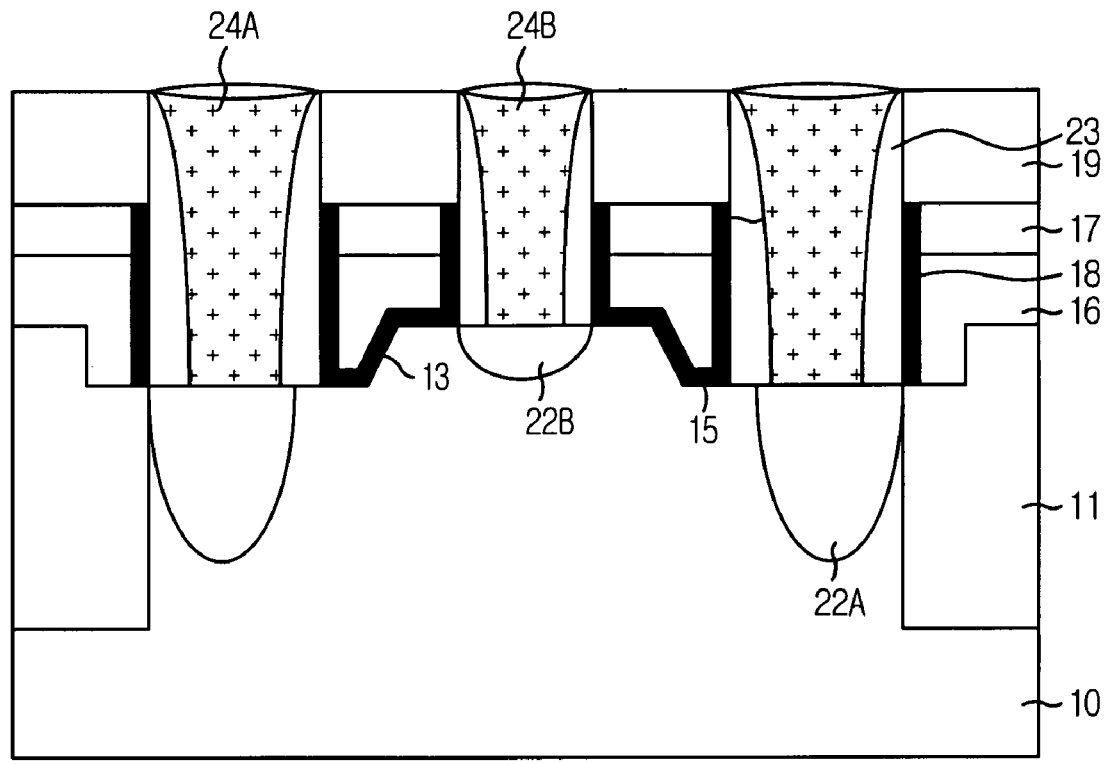
Figure 4:
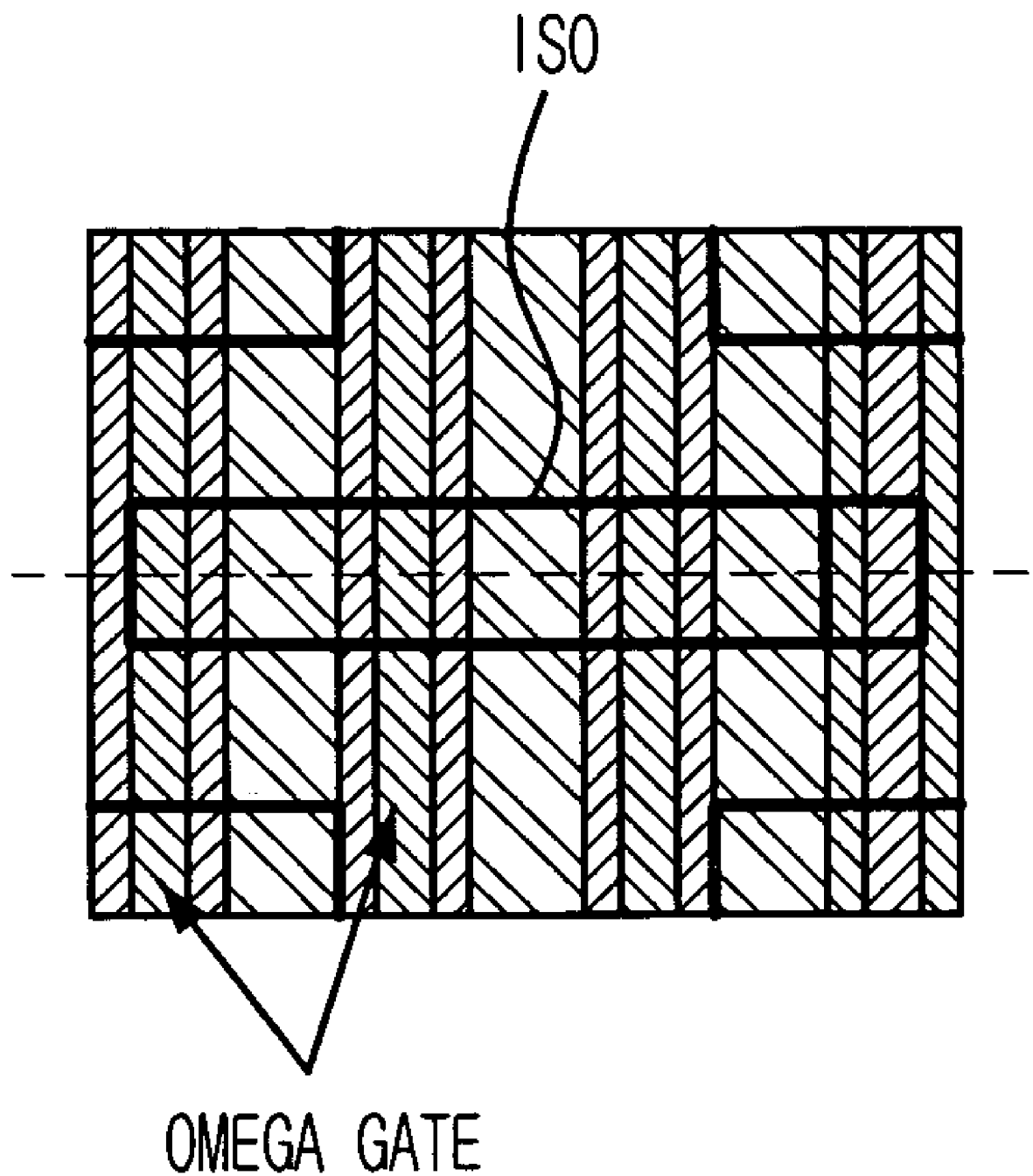
FIG. 4 is a top view showing a semiconductor device in accordance with a first embodiment of the present invention.

FIG. 4 is a top view showing a semiconductor device in accordance with a first embodiment of the present invention.

The gate structures shown in FIG. 4 are formed differently from the conventional gate structures. Particularly, a bottom portion of the individual gate structure is formed in the shape of 'Ω'. This specific shape of the gate structures (hereinafter "omega gate structure") increases channel lengths of the gate structures whose widths are the same. Particularly, instead of employing a conventional lithography process, a descum process is performed to form the omega gate structures. The descum process removes photoresist remnants or other contaminants that may still remain on regions where a developing process is performed after a patterning process using photoresist. That is, since photoresist remnants or other contaminants are more likely to remain on a region where the photoresist is removed after the photolithography process, these photoresist remnants and contaminants are removed by using oxygen plasma prior to an etching process. Also, a reference denotation 'ISO' is a mask pattern for forming device isolation layers.

As mentioned above, the implementation of the gate patterning process is difficult when semiconductor devices are micronized. Thus, forming a pattern smaller than a gate structure is much difficult. However, according to the first embodiment of the present invention, the descum process makes it possible to obtain the above mentioned omega gate structures without directly patterning the bottom parts of the gate structures. Detailed description of such semiconductor device with the omega gate structures will be provided hereinafter.

FIGS. 5A to 5G are cross-sectional views of the semiconductor device according to the first embodiment of the present invention for illustrating a method for fabricating the same. Especially, the method of forming N-channel metal oxide semiconductor (NMOS) transistors is illustrated.

Figure 5A:
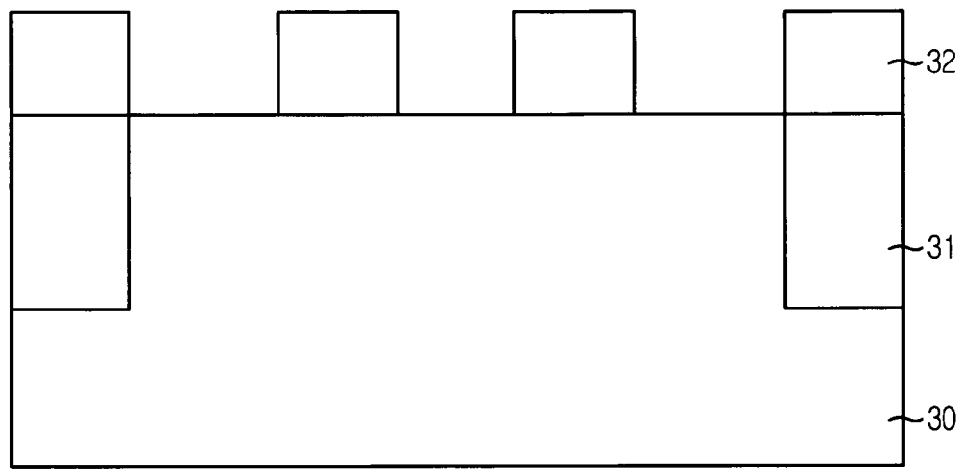
FIGS. 5A to 5G are cross-sectional views of the semiconductor device fabricated according to the first embodiment of the present invention for illustrating a method for fabricating the same.

Referring to FIG. 5A, device isolation layers 31 are formed on a substrate 30. The device isolation layers 31 are formed by filling silicon oxide into trenches, which are formed in the substrate 30, using high density plasma (HDP). Then, photoresist patterns 32 are formed on the substrate 30. The photoresist patterns 32 are formed to supplement formation of omega gate structures.

Figure 5B:
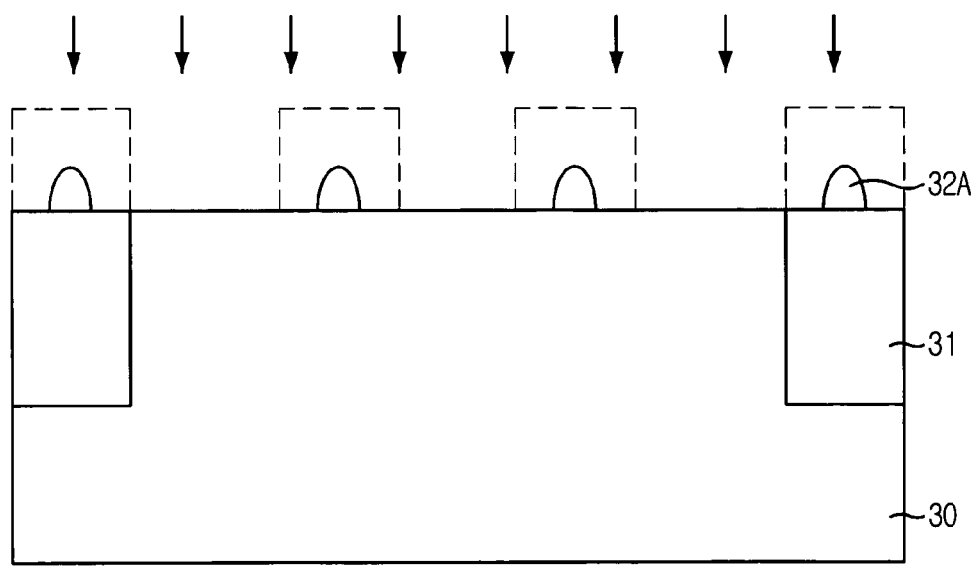

Referring to FIG. 5B, the photoresist patterns 32 are formed to be omega gate patterns 32A each of which width is smaller than that of an individual gate structure. In more detail of the omega gate pattern 32A formation, the photoresist patterns 32 are overly photo-exposed or an additional mask for forming the omega gate patterns 32A is used to form smaller photoresist patterns than the gate structures. Then, the patterned photoresist patterns are subjected to a bake process at temperature of approximately 120° C. for approximately 90 seconds to harden the patterned photoresist patterns 32. Then, a wafer is placed into an oxygen plasma chamber, and a descum process is performed on the baked photoresist patterns 32 without any directionality at an oxidation rate of approximately 40 Å to approximately 50 Å per second. Through the descum process using oxygen plasma, the omega gate patterns 32A each with the intended size is formed. The individual omega gate pattern 32A remaining after the descum process has the size that is approximately one third or two third of the gate feature size. For instance, if the gate structures have the width of approximately 100 nm, removal amounts of the photoresist patterns 32 via the descum process are controlled such that the omega gate patterns 32A have the width of approximately 30 nm to approximately 60 nm.

A process for eliminating a difference in height between the device isolation layers 31 and the substrate 30 is performed to prevent a defect generation usually caused by the height difference.

Figure 5C:
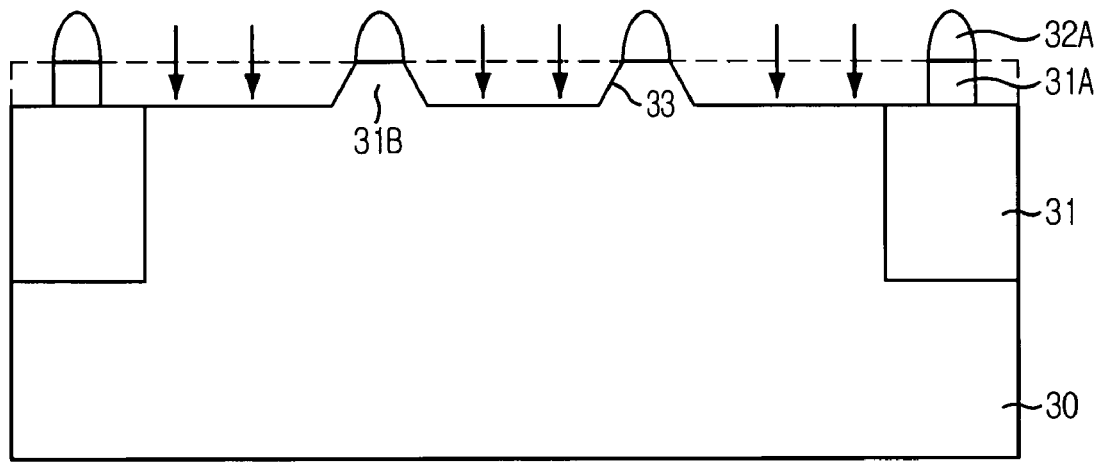

Referring to FIG. 5C, with use of the omega gate patterns 32A as an etch mask, predetermined portions of the substrate 30 are removed to form the trenches 33. Particularly, this etching process is implemented in a range of angle from approximately 10 degrees to approximately 90 degrees, and the individual trench 33 has a depth ranging from approximately 30 Å to approximately 500 Å. Therefore, this angled etching on the predetermined portions of the substrate 30 produces protruded portions 31B of the substrate 30 between the trenches 33. The target gate structures are formed to encompass the protruded portions 31B of the substrate 30 and thus, obtaining the omega-shaped gate structures. A reference numeral 31A denotes a patterned device isolation layer after this etching process. Since channels are formed along the protruded portions 31B, the channel lengths increase even the sizes of the gate structures are the same.

Afterwards, a P-type well (not shown) is formed using a well mask. The P-type well defines an NMOS transistor region; particularly, the P-type well defines N-type junction regions for source/drain regions of the NMOS transistor.

Figure 5D:
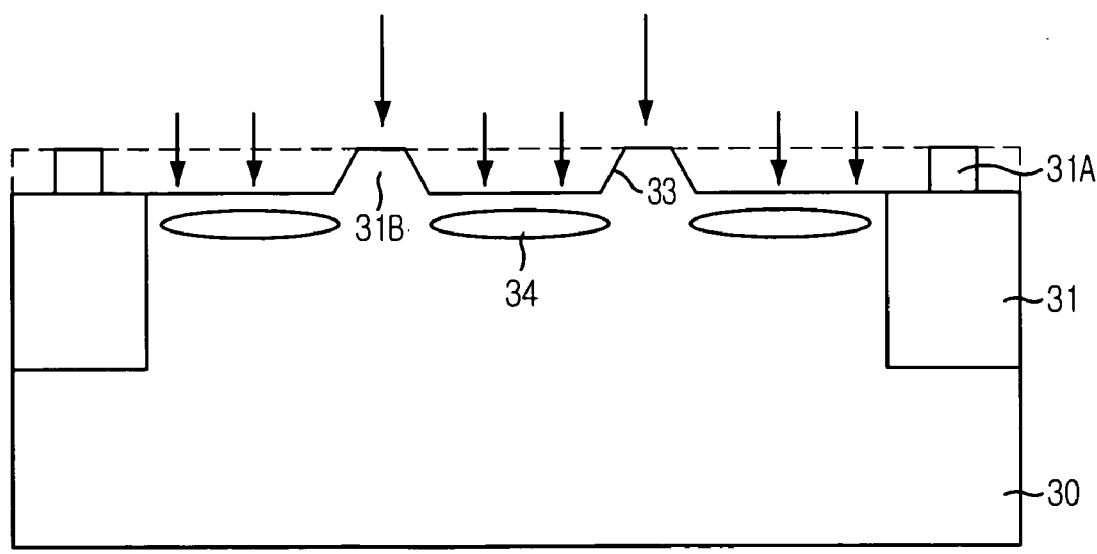

Referring to FIG. 5D, the omega gate patterns 32A are removed. A first ion implantation process is performed into regions where storage node junction regions and a bit line junction region are to be formed to thereby form a plurality of first impurity regions 34. The first ion implantation process utilizes a low concentration of P-type impurities. The first ion implantation process is to control a threshold voltage of MOS transistors, particularly, NMOS transistors.

Figure 5E:
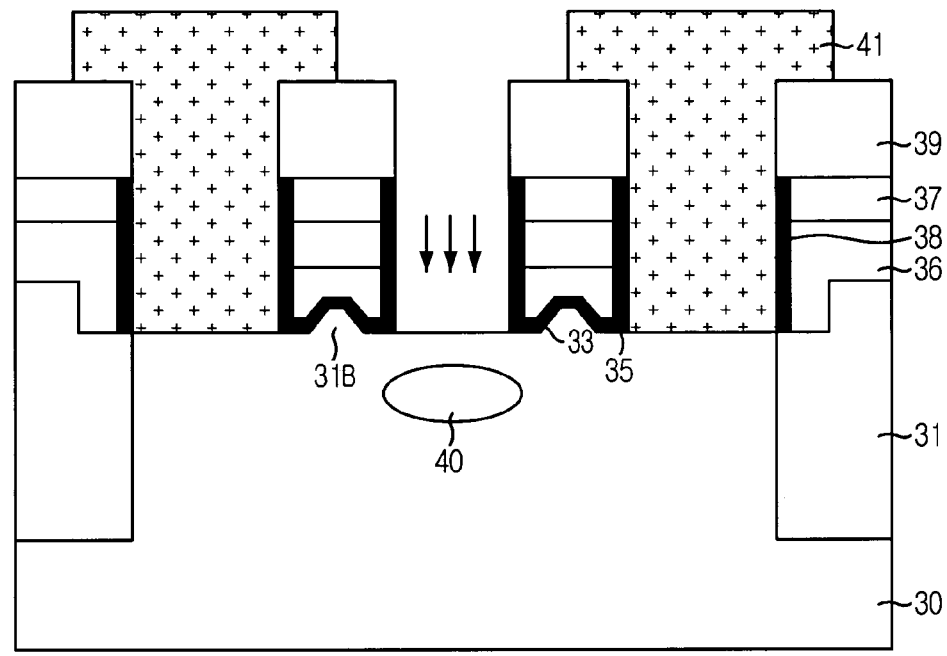

Referring to FIG. 5E, a gate structure formation process is performed. More specifically, each gate structure is formed in a stack structure including a first gate insulation layer 35, a second gate insulation layer 38, a gate polysilicon layer 36, a gate metal layer 37, and a gate hard mask layer 39. The first and second gate insulation layers 35 and 38 are oxide-based layers, which are obtained through a gate oxidation process and a light oxidation process, respectively. The light oxidation process is performed on sidewalls of the gate structures after the sequential formation of the first gate insulation layer 35, the gate polysilicon layer 36, the gate metal layer 37, and the gate hard mask layer 39. The gate hard mask layer 39 serves a role in protecting the gate structures against a subsequent self-aligned etching process for forming contact plugs.

Next, a photoresist pattern 41 is formed to mask the storage node junction regions and then, a second ion implantation process is performed on the bit line junction region to form a second impurity region 40. The second ion implantation process utilizes a P-type impurity, which is selected from a group consisting of boron (B), boron difluoride ($BF_2$) and indium (In). An N-type impurity such as phosphorus (P) or arsenic (As) can be additionally implanted to prevent an abrupt increase in resistance of the drain regions.

Figure 5F:
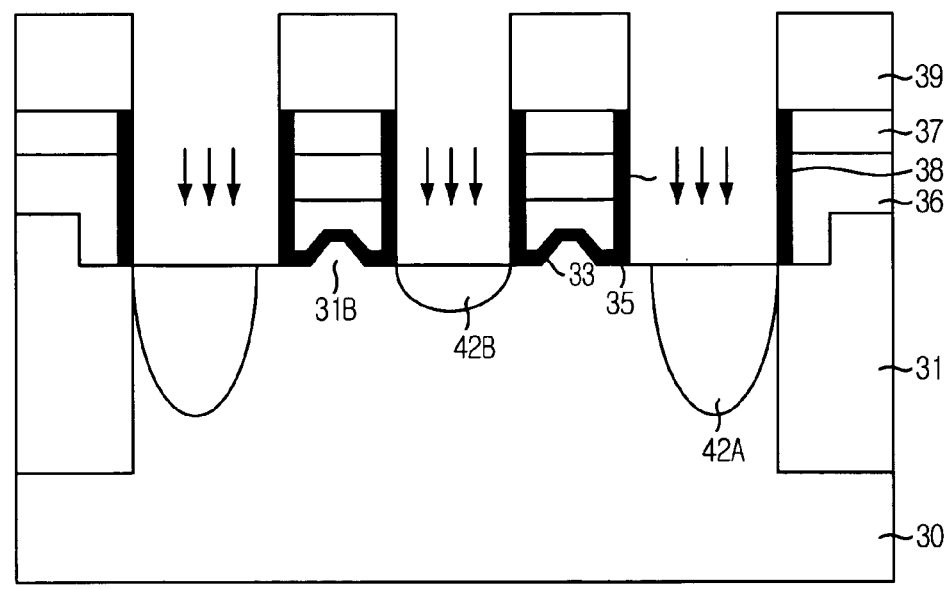

Referring to FIG. 5F, a first junction regions 42A and a second junction region 42B are formed through a third ion implantation process using N-type impurities. The first junction regions 42A are the aforementioned storage node junction regions and the second junction 42B is the aforementioned bit line junction region. Since the second junction region 42B is implanted with the P-type impurity prior to the third ion implantation process, the first junction regions 42A and the second junction region 42B are formed asymmetrically. A depth difference between the first junction region 42A and the second junction region 42B is in a range of approximately 1 Å to approximately 50 Å.

Preferably, a concentration of the P-type impurity implanted to form the first junction regions 42A is lower than that of the P-type impurity implanted to form the second junction region 42B by above approximately $1 \times 10^{17}$ cm$^{-3}$. A concentration of the N-type impurity implanted to form the second junction region 42B is higher than that of the P-type impurity implanted for forming the first junction region 42A by above approximately $1 \times 10^{17}$ cm$^{-3}$.

Figure 5G:
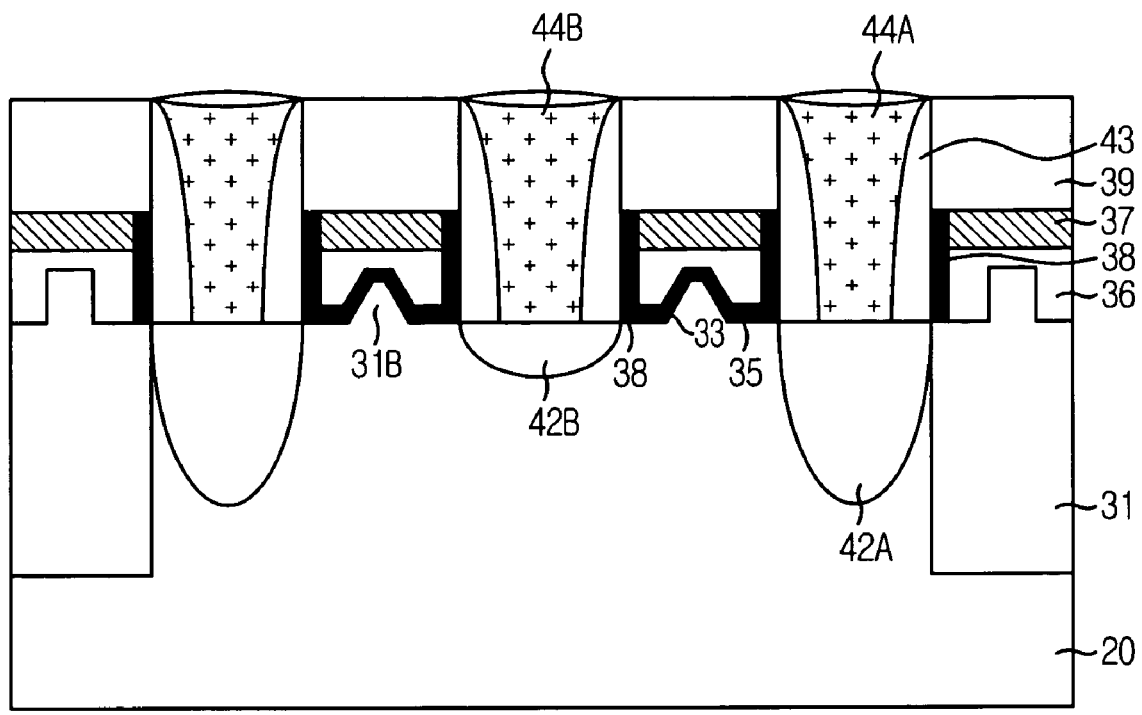

Referring to FIG. 5G, sidewall insulation layers 43 are formed on the sidewalls of the gate structures. The sidewall insulation layers 43 are formed of a material selected from a group consisting of silicon oxide, silicon nitride and combination thereof. A bit line plug 44B and a plurality of storage node contact plugs 44A are formed. As mentioned above, the storage node contact plugs 44A are connected with the first junction regions 42A and the bit line contact plug 44B is connected with the second junction region 42B.

By forming the omega gate structures, widths of the gate structures can be maintained the same, thereby increasing channel lengths. Hence, if the channels are N-type channels, concentrations of impurities such as boron can be decreased.

The decreased impurity concentrations at the N-type channels make it possible to reduce electric fields between the storage nodes and the channels. As a result, it is easy to secure an intended level of refresh time (tREF), whereby operation characteristics of semiconductor memory devices can be enhanced.

Also, compared with a conventional patterning process, a descum process forms the omega gate patterns which are smaller than the gate structures more effectively and stably.

Figure 6:
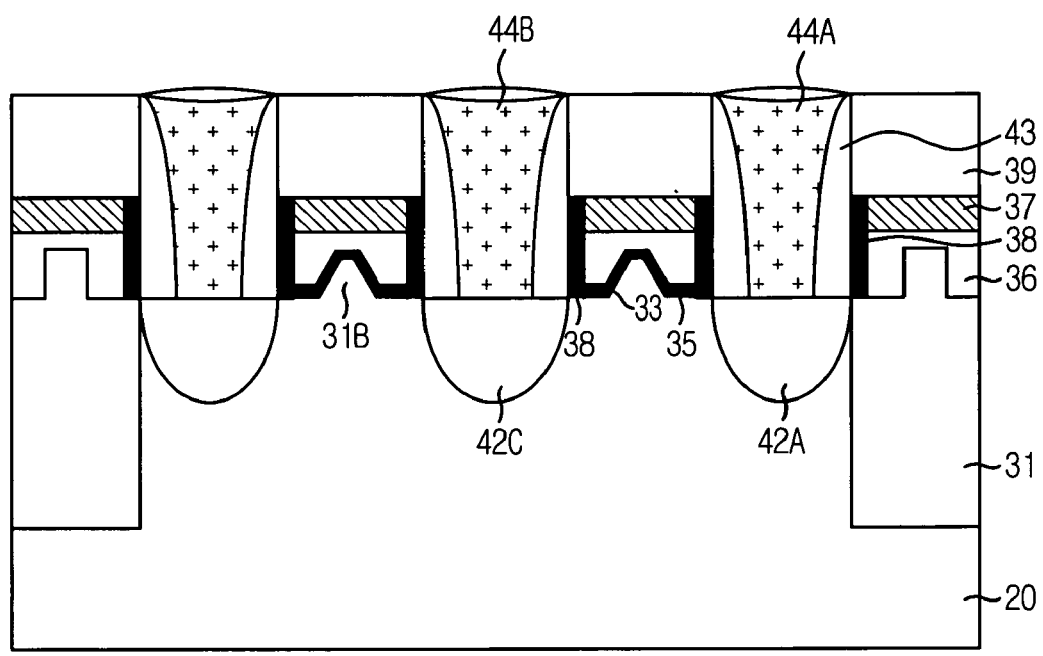
FIG. 6 is a cross-sectional view showing a semiconductor device in accordance with a second embodiment of the present invention.

FIG. 6 is a cross-sectional view of a semiconductor memory device according to a second embodiment of the present invention for illustrating a method for fabricating the same.

Being different from the first embodiment of the present invention, wherein the bit line junction region 42B and the storage junction regions 42A are formed asymmetrically, a bit line junction region 42C and storage junction regions 42A are formed symmetrically. According to the second embodiment, the second ion implantation process, which is performed to form the bit line junction region (i.e., the second junction region 42B) in the first embodiment, is omitted in order to form the symmetric junction regions.

According to the first and second embodiments of the present invention, channel lengths can be increased without enlarging gate structures by forming bottom portions of gate structures in an omega shape. By increasing the channel lengths, concentrations of impurities polarized in opposite direction to the channel regions can be decreased, and as a result, electric fields between storage nodes and channels are decreased. The decreased electric fields result in an ease of securing a refresh time (tREF), thereby improving operation characteristics of semiconductor memory devices.

Also, instead of using a conventional patterning process, a descum process is employed to form omega gate patterns smaller than the gate structures. Compared with the conventional patterning process, the descum process makes it possible to form omega gate structures more effectively and stably.

The present application contains subject matter related to the Korean patent application No. 2004-0113894, filed in the Korean Patent Office on Dec. 28, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
    forming a device isolation region in a substrate;
    forming photoresist patterns on the substrate where a plurality of gate structures are to be formed;
    reducing widths of the photoresist patterns by using a descum process until the widths of the photoresist patterns are smaller than those of the gate structures;
    removing predetermined portions of the substrate using the reduced-width photoresist patterns as an etch mask, thereby forming a plurality of protruded patterns, each of the protruded patterns protruding upwardly from the substrate and having a first side and a second side sloping downward from a top provided between the first and second sides such that each protruded pattern forms a cross-sectional shape of a trapezoid; and
    forming a plurality of gate conductive layers for the gate structures over the protruded patterns, respectively, wherein the width of each gate conductive layer is greater than the width of each protruded pattern, wherein each gate conductive layer is formed over the first side, the top, and the second side of the corresponding protruded pattern so as to extend below the top of the protruded pattern and along profiles of the first side, the top and the second side of the protruded pattern.

2. The method of claim 1, wherein the gate conductive layer includes silicon and each of the gate structures further includes a gate insulation layer and a gate metal layer.

3. The method of claim 1, wherein the predetermined portions of the substrate are removed until reaching a depth ranging from approximately 30 Å to approximately 500 Å.

4. The method of claim 3, wherein removing the predetermined portions of the substrate is performed by etching the predetermined portions of the substrate at an angle of approximately 10 degrees to approximately 90 degrees such that the protruded patterns have the cross-sectional shape of a trapezoid.

5. The method of 1, wherein the widths of the protruded patterns are in a range of approximately one third to approximately two thirds of the widths of the gate structures.

6. The method of claim 1, wherein forming of the device isolation region comprises:
    forming trench type device isolation layers in the substrate; and
    removing upper portions of the device isolation layers, thereby eliminating a height difference between the device isolation layers and the substrate.

7. The method of claim 1, wherein the first and second sides define the width of each protruded pattern.

8. The method of claim 1, wherein each protruded pattern is made of silicon.

9. A method for fabricating a semiconductor device, the method comprising:
    forming a device isolation region in a substrate;
    forming photoresist patterns on the substrate where a plurality of gate structures are to be formed;
    reducing widths of the photoresist patterns by using a descum process until the widths of the photoresist patterns are smaller than those of the gate structures;
    removing predetermined portions of the substrate using the reduced-width photoresist patterns as an etch mask, thereby forming a plurality of protruded patterns, each of the protruded patterns having the cross-sectional shape of a trapezoid, protruding upwardly from the substrate, and defining a first side, a second side, and a top provided between the first and second sides, the first side and the second side sloping downwardly from the top such that each protruded pattern forms the cross-sectional shape of a trapezoid; and
    forming a plurality of gate conductive layers for the gate structures over the protruded patterns, respectively, wherein each gate structure conductive layer layer has a first portion extending beyond the first side and a second portion extending beyond the second side, wherein the gate conductive layer is formed over the first side, the top, and the second side of the corresponding protruded pattern so as to extend below the top of the protruded pattern and along profiles of the first side, the top and the second side of the protruded pattern.

10. The method of claim 9, wherein each protruded pattern is made of silicon.

11. The method of claim 9, wherein each protruded pattern is wrapped around by a corresponding gate structure.

12. A method for fabricating a semiconductor device, the method comprising:
    forming a device isolation region in a semiconductor material;
    forming a photoresist pattern on the semiconductor material where a gate structure is to be formed;
    reducing a width of the photoresist pattern by using a descum process until the width of the photoresist patterns is smaller than that of the gate structure;
    removing predetermined portions of the semiconductor material using the reduced-width photoresist pattern as an etch mask, thereby forming a protruded pattern protruding upwardly from the semiconductor material and defining a first side, a second side, and a third side provided between the first and second sides, wherein the third side is elevated relative to the first and second sides and the first and second sides slope downwardly from the third side such that the protruded pattern forms a cross-sectional shape of a trapezoid; and
    forming a gate conductive layer over the protruded pattern, the gate conductive layer surrounding the protruded pattern on the first, second, and third sides of the protruded pattern so as to extend below the top of the protruded pattern and along profiles of the first, second, and third sides of the protruded pattern.

* * * * *